US008617667B2

(12) United States Patent
Kovacs et al.

(10) Patent No.: US 8,617,667 B2
(45) **Date of Patent: *Dec. 31, 2013**

(54) METHODS OF LEVELING INK ON SUBSTRATES AND APPARATUSES USEFUL IN PRINTING

(75) Inventors: Gregory J. Kovacs, Webster, NY (US); Steven E. Ready, Los Altos, CA (US); David K. Biegelsen, Portola Valley, CA (US); Lars E. Swartz, Sunnyvale, CA (US); Christopher Paulson, Livermore, CA (US)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 924 days.

This patent is subject to a terminal disclaimer.

(21) Appl. No.: 12/764,394

(22) Filed: Apr. 21, 2010

(65) Prior Publication Data

US 2011/0261127 A1 Oct. 27, 2011

(51) Int. Cl.

| | |
|---|---|
| ***B05D 3/06*** | (2006.01) |
| ***C23C 14/28*** | (2006.01) |
| ***H05B 6/00*** | (2006.01) |
| ***B41J 2/01*** | (2006.01) |

(52) U.S. Cl.

USPC ............................ 427/558; 427/595; 347/102

(58) Field of Classification Search

USPC ........................................ 101/424.1; 347/102

See application file for complete search history.

(56) References Cited

U.S. PATENT DOCUMENTS

| | | | | |
|---|---|---|---|---|
| 7,559,639 | B2 | 7/2009 | Belelie et al. | |
| 2006/0066703 | A1* | 3/2006 | Kadomatsu et al. | 347/102 |
| 2007/0120919 | A1 | 5/2007 | Goredema et al. | |
| 2007/0123606 | A1 | 5/2007 | Toma et al. | |
| 2009/0160924 | A1* | 6/2009 | Pattekar et al. | 347/102 |

OTHER PUBLICATIONS

Roof et al.; "Dual-Web Apparatus for Fixing a Radiation-Curable Gel-Ink Image on a Substrate"; U.S. Appl. No. 12/256,684, filed Oct. 23, 2008.

Roof et al.; U.S. Appl. No. 12/256,670; "Method and Apparatus for Fixing a Radiation-Curable Gel-Ink Image on a Substrate"; filed Oct. 23, 2008.

Roof et al.; "Apparatus for Fixing a Radiation-Curable Gel-Ink Image on a Substrate"; U.S. Appl. No. 12/256,690, filed Oct. 23, 2008.

* cited by examiner

*Primary Examiner* — Michael Cleveland
*Assistant Examiner* — James M Mellott
(74) *Attorney, Agent, or Firm* — Ronald E. Prass, Jr.; Prass LLP

(57) ABSTRACT

Methods of leveling ink on substrates and apparatuses useful in printing are provided. An exemplary embodiment of the methods includes irradiating ink disposed on a surface of a porous substrate with radiation emitted by at least one radiant energy source. The radiation heats the ink to at least a viscosity threshold temperature of the ink to allow the ink to flow laterally on the surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate.

19 Claims, 10 Drawing Sheets

AS PRINTED 1000 mm/s 750 mm/s 500 mm/s 250 mm/s 125 mm/s

AS PRINTED 1000 mm/s 750 mm/s 500 mm/s 250 mm/s 125 mm/s

AS PRINTED 1000 mm/s 750 mm/s 500 mm/s 250 mm/s 125 mm/s

METHODS OF LEVELING INK ON SUBSTRATES AND APPARATUSES USEFUL IN PRINTING

RELATED APPLICATIONS

This application is related to the application entitled "METHODS OF LEVELING INK ON SUBSTRATES USING FLASH HEATING AND APPARATUSES USEFUL IN PRINTING," U.S. patent application Ser. No. 12/764,488, now U.S. Pat. No. 8,178,169, which is filed on the same date as the present application.

BACKGROUND

In printing processes, marking material is applied onto substrates to form images. In some processes, the printed images can exhibit microbanding and print-through on the substrates.

It would be desirable to provide methods of leveling ink on substrates and apparatuses useful in printing that can produce high-quality printed images on different types of substrates.

SUMMARY

Methods of leveling ink on substrates and apparatuses useful in printing are provided. An exemplary embodiment of the methods of leveling ink on a substrate comprises irradiating ink disposed on a first surface of a porous substrate with first radiation emitted by at least one first radiant energy source. The first radiation heats the ink to at least a viscosity threshold temperature of the ink to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate.

DRAWINGS

Figure 6A:
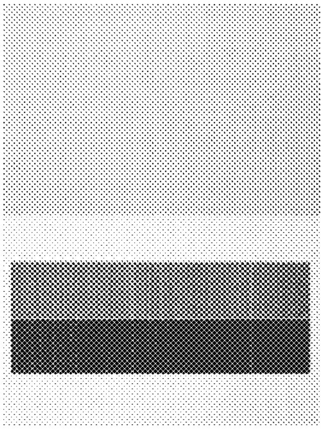
Figure 6B:
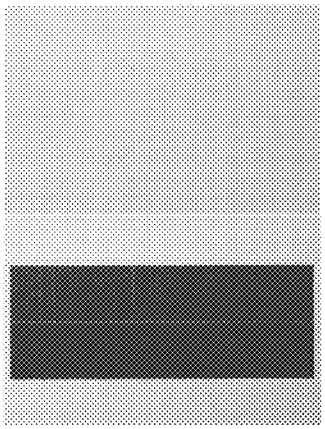
Figure 6C:
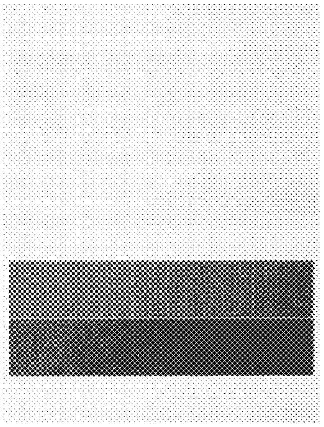

FIGS. 6A to 6F show pictures, top side left to right, of 600×600 dpi patches (modified with every seventh line blank) and 600×300 dpi patches each with a width of 0.5 in. The patches were printed with a standard black UV gel ink containing 7.5 wt % gel and 5 wt % wax on 4200 paper. FIG. 6A shows as-printed patches. FIGS. 6B to 6F show patches following leveling using a tungsten lamp (rated power of 1200 W at rated lamp voltage of 144 V, actual lamp voltage of 208 V, actual power of 2114 W) for paper transport speeds of 1000 mm/s, 750 mm/s, 500 mm/s, 250 mm/s and 125 mm/s, respectively. The pictures are viewed from the top side left to right (left half of FIGS. 6A to 6F) and bottom side right to left (right half of FIGS. 6A to 6F) of the paper.

Figure 6D:
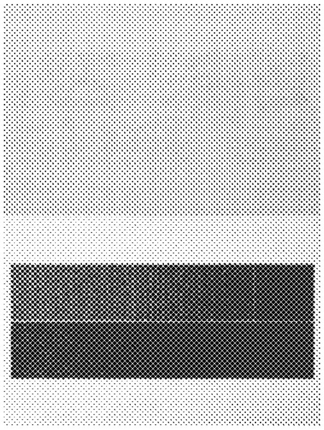
Figure 6E:
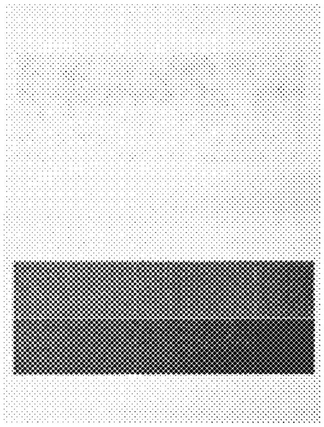
Figure 6F:
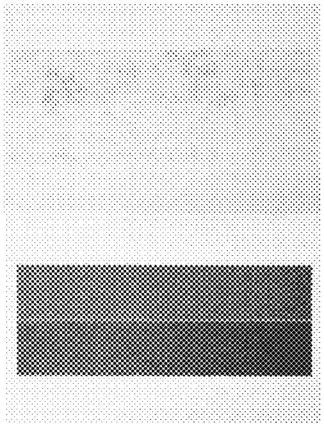
Figure 7:
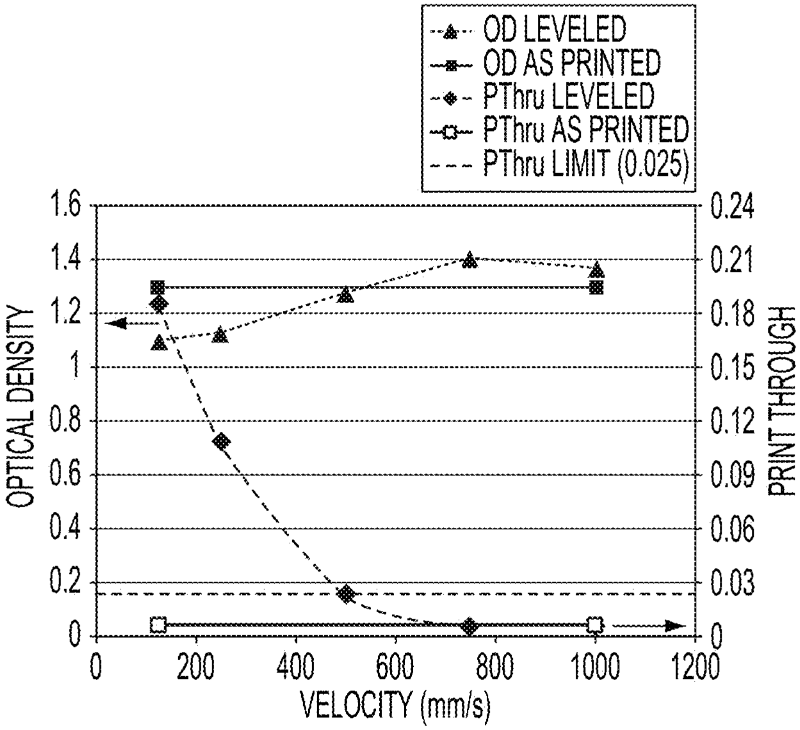

FIG. 7 illustrates curves showing the optical density and corresponding print-through versus paper transport speed for the as-leveled 600×600 dpi patches depicted in FIGS. 6B to 6F and the as-printed optical density and print-through for the patches depicted in FIG. 6A.

Figure 8A:
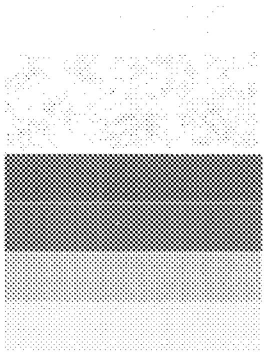
Figure 8B:
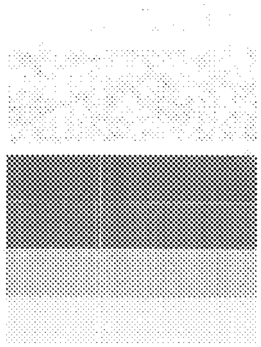
Figure 8C:
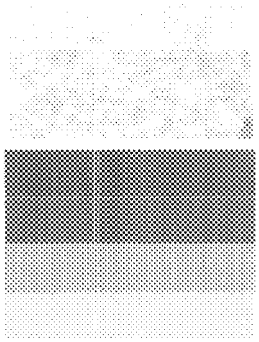
Figure 8D:
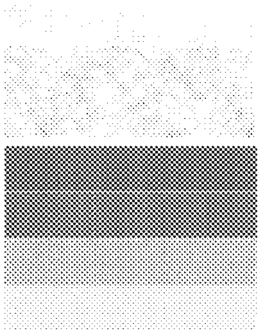
Figure 8E:
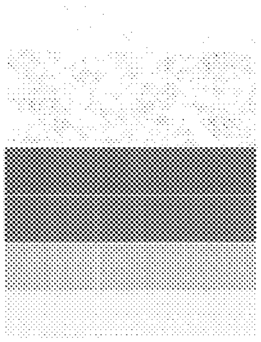
Figure 8F:
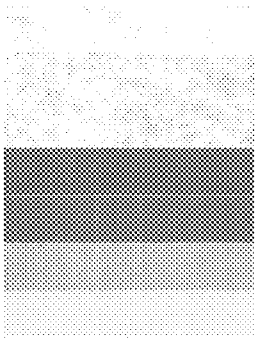

FIGS. 8A to 8F show pictures, top side right to left, of 600×600 dpi patches, 600×600 dpi patches modified with every seventh line blank, 600×150 dpi patches, and 150×150 dpi patches, each having a width of 0.5 in. The patches were printed with a standard cyan UV gel ink formulation containing 7.5 wt % gel and 5 wt % wax on 4200 paper. FIG. 8A shows as-printed patches. FIGS. 8B to 8F show patches following leveling using a tungsten lamp (rated power of 500 W at rated lamp voltage of 120 V, actual lamp voltage of 208 V, actual power of 1166 W) for paper transport speeds of 1000 mm/s, 750 mm/s, 500 mm/s, 250 mm/s and 125 mm/s, respectively. The pictures are viewed from the top side right to left (left half of FIGS. 8A to 8F) and bottom side left to right (right half of FIGS. 8A to 8F) of the paper.

Figure 9:
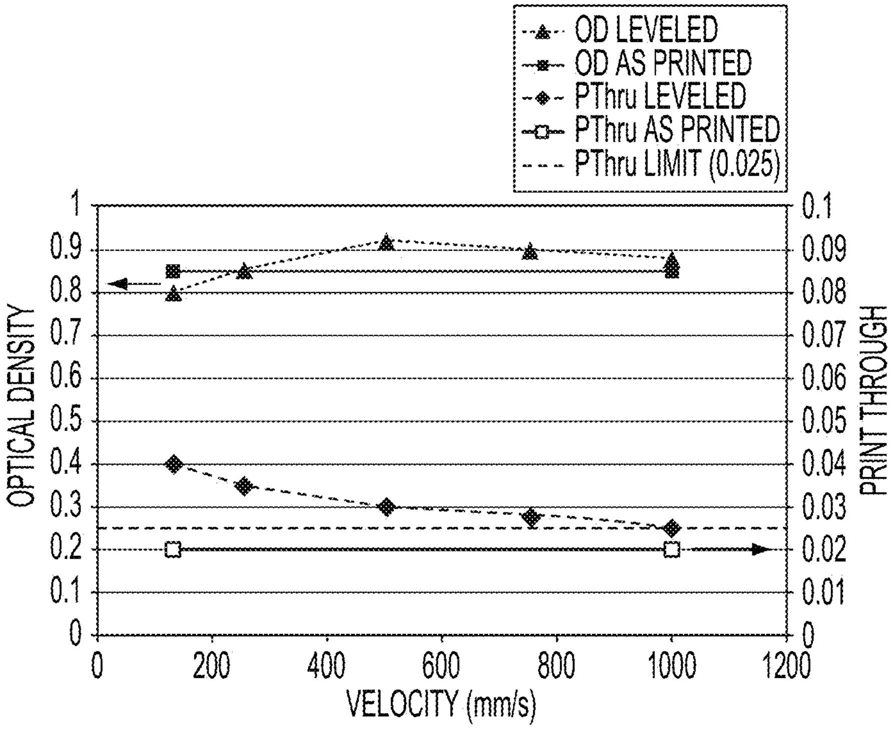

FIG. 9 illustrates curves showing the optical density and corresponding print-through versus paper transport speed for the as-leveled 600×600 dpi patches depicted in FIGS. 8B to 8F and the as-printed optical density and print-through for the patches depicted in FIG. 8A.

FIGS. 10A to 10F show pictures, top side right to left, of 600×600 dpi patches, 600×600 dpi patches modified with every seventh line blank, 600×150 dpi patches, and 150×150 dpi patches, each having a width of 0.5 in.

Figure 10A:
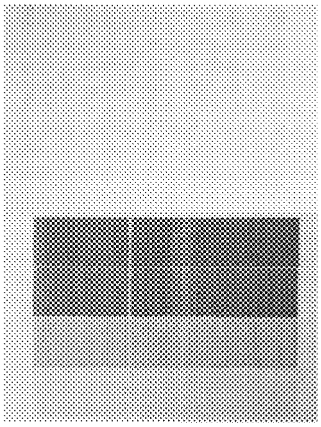
Figure 10B:
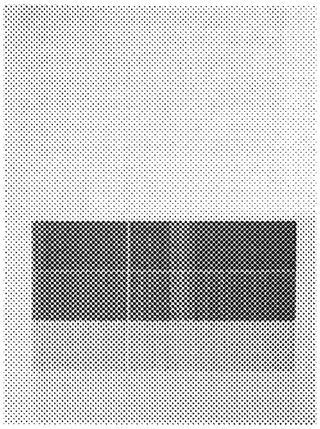
Figure 10C:
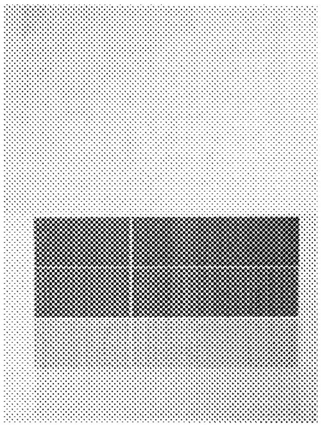
Figure 10D:
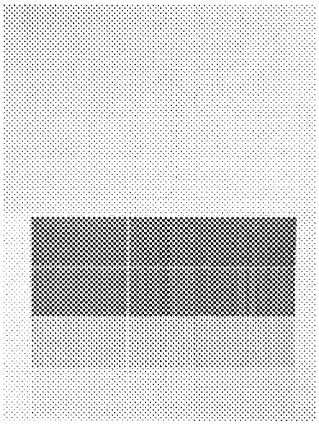
Figure 10E:
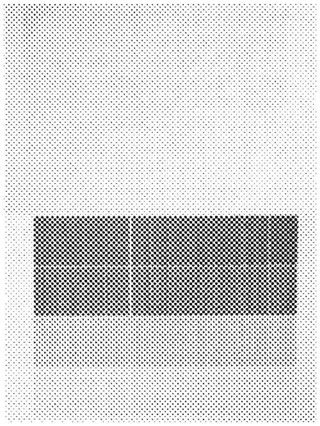
Figure 10F:
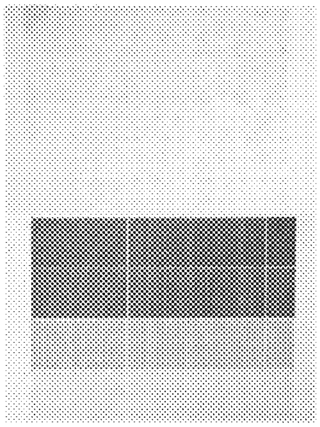

The patches were printed with a cyan UV gel ink containing 10 wt % gel and 10 wt % wax on 4200 paper. FIG. 10A shows as-printed patches. FIGS. 10B to 10F show patches following leveling using a tungsten lamp (rated power of 500 W at rated lamp voltage of 120 V, actual lamp voltage of 208 V, actual power of 1166 W) for paper transport speeds of 1000 mm/s, 750 mm/s, 500 mm/s, 250 mm/s and 125 mm/s, respectively. The pictures are viewed from the top side right to left (left half of FIGS. 10A to 10F) and bottom side left to right (right half of FIGS. 10A to 10F) of the paper.

Figure 11:
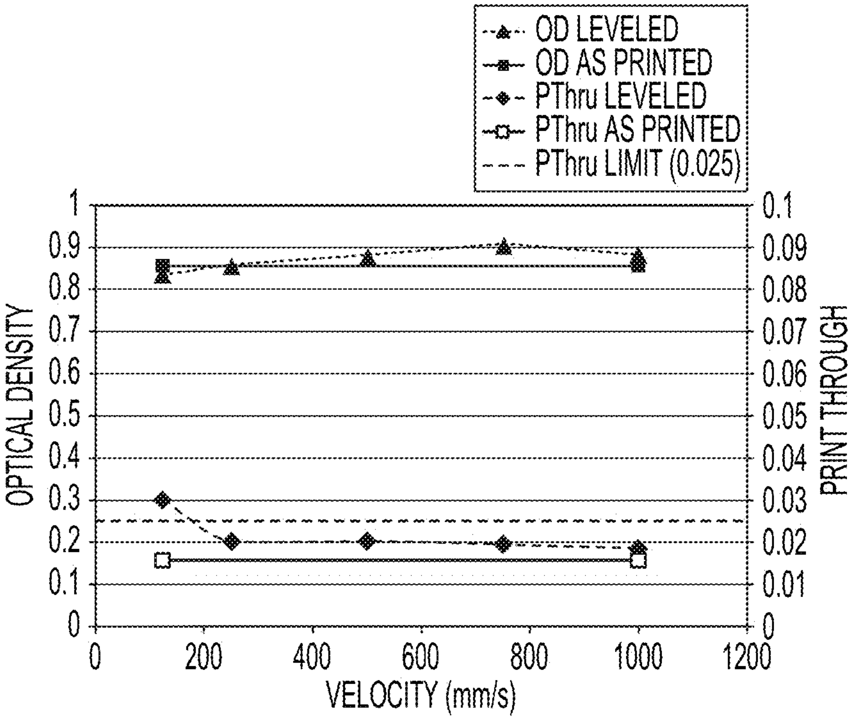

FIG. 11 illustrates curves showing the optical density and corresponding print-through versus paper transport speed for the as-leveled 600×600 dpi patches depicted in FIGS. 10B to 10F and the as-printed optical density and print-through for the patches depicted in FIG. 10A.

DETAILED DESCRIPTION

The disclosed embodiments include methods of leveling ink on substrates. An exemplary embodiment of the methods comprises irradiating ink disposed on a first surface of a porous substrate with first radiation emitted by at least one first radiant energy source. The first radiation heats the ink to at least a viscosity threshold temperature of the ink to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate.

Another exemplary embodiment of the methods of leveling ink on substrates comprises irradiating a gel ink disposed on a surface of a substrate with first radiation emitted by at least one first radiant energy source. The surface is non-permeable with respect to the gel ink. The first radiation rapidly heats the gel ink to at least a viscosity threshold temperature of the gel ink to allow the gel ink to flow laterally on the surface to produce leveling of the gel ink.

The disclosed embodiments further include apparatuses useful in printing. An exemplary embodiment of the apparatuses comprises a marking device for applying ink to a first surface of a porous substrate, the ink having a viscosity threshold temperature at which the ink has a viscosity midway between a minimum value and a maximum value of the ink; and a leveling device including at least one first radiant energy source which emits first radiation onto ink applied to the first surface of the porous substrate. The first radiation heats the ink to at least the viscosity threshold temperature of the ink to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate.

Ultraviolet light (UV)-curable inks can be used in printing processes to form images on substrates. UV-curable inks are applied to a surface of a substrate and then exposed to UV light to cure the ink and fix images onto the surface. It has been noted that low-viscosity, UV-curable inks display an unacceptably-high degree of print-through when applied on plain paper substrates, which are porous. Print-through is a measure of ink permeation in the thickness direction of the substrates. Print-through makes low-viscosity, UV-curable inks unsatisfactory for printing applications with plain paper substrates.

UV-curable gel inks ("UV gel inks") are another type of marking material that can be used to form images on substrates. These inks offer desirable properties including higher viscosities than conventional, low-viscosity, UV-curable inks. UV gel inks are heated to abruptly reduce their viscosity and then applied to substrates. These inks freeze upon contact with the cooler substrates. It has been noted that freezing of UV gel inks upon initial impingement onto substrates, such as paper, and ink drop misdirection can result in micro-banding of images formed on the substrates.

UV-curable inks applied to substrates can be leveled by applying pressure to the inks as disclosed in U.S. patent application Ser. No. 12/256,670 now U.S. Pat. No. 8,231,214, to Roof et al., filed on Oct. 23, 2008 and entitled "Method and Apparatus for Fixing a Radiation-Curable Gel-Ink Image on a Substrate"; U.S. patent application Ser. No. 12/256,684 now U.S. Pat. No. 8,002,936, to Roof et al., filed on Oct. 23, 2008 and entitled "Dual-Web Apparatus for Fixing a Radiation-Curable Gel-Ink Image on a Substrate" and U.S. patent application Ser. No. 12/256,690 now U.S. Pat. No. 8,323,438, to Roof et al., filed on Oct. 23, 2008 and entitled "Apparatus for Fixing a Radiation-Curable Gel-Ink Image on a Substrate," each of which is incorporated herein by reference in its entirety.

Images formed on substrates using UV gel inks can be leveled without physical contact with the images using an IR-VIS (infrared-visible radiation) radiant energy source. It has been noted that extended heating of UV gel inks using such sources can produce print-through on porous, plain paper substrates due to the amount of energy that is transferred to the substrates during the extended heating period, and the subsequent penetration of the ink through the warm paper.

In view of these observations regarding UV gel inks, as well as other types of inks, methods of leveling ink on substrates and apparatuses useful in printing that can be used to perform the methods are provided. Embodiments of the methods and apparatuses can level different types of inks on substrates. The inks used to form images on substrates can be any suitable ink composition that thermally quenches into a sufficiently-rigid state and has a sufficiently-sharp melting transition at an elevated temperature relative to the substrate temperature. Exemplary inks can exhibit a viscosity range of about $10^1$ to about $10^6$ cP over a temperature range of less than about 40 Celsius degrees, less than about 30 Celsius degrees, less than about 20 Celsius degrees, or less than about 10 Celsius degrees, for example.

Figure 1:
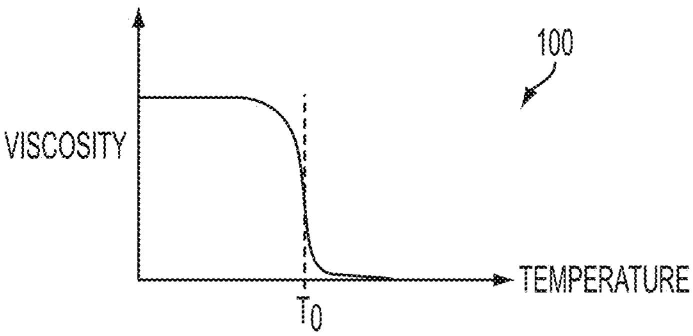
FIG. 1 depicts a curve illustrating the relationship between marking material viscosity and temperature for an exemplary marking material.

For example, gel inks can be leveled on substrates in embodiments of the methods and apparatuses. FIG. 1 depicts a curve illustrating the viscosity as a function of temperature for a typical gel ink that has properties compatible with exemplary embodiments of the disclosed methods of leveling ink on substrates. As shown, the viscosity profile for the gel ink has a sharp threshold and the ink transitions from being relatively viscous (having a viscosity of, e.g., on the order or greater than about $10^6$ cP) and unable to flow easily, to being relatively non-viscous (having a viscosity of, e.g., on the order of less than about $10^1$ cP) and able to flow easily over a relatively narrow temperature range where. Such gel inks can exhibit a large change in viscosity over a small temperature range of less than about 40 Celsius degrees, less than about 30 Celsius degrees, less than about 20 Celsius degrees, or less than about 10 Celsius degrees, for example. Such gel inks thermally quench into a sufficiently-rigid state and have a sufficiently-sharp melting transition at an elevated temperature relative to the substrate temperature to be compatible with exemplary embodiments of the disclosed methods of leveling inks on substrates.

Exemplary inks having properties as depicted in FIG. 1 and which can be used to form images on substrates in embodiments of the disclosed methods and apparatuses are described in U.S. Patent Application Publication No. 2007/0120919, which discloses a phase change ink comprising a colorant, an initiator, and an ink vehicle; in U.S. Patent Application Publication No. 2007/0123606, which discloses a phase change ink comprising a colorant, an initiator, and a phase change ink carrier; and in U.S. Pat. No. 7,559,639, which discloses a radiation curable ink comprising a curable monomer that is liquid at 25° C., curable wax and colorant that together form a radiation curable ink, each of which is incorporated herein by reference in its entirety.

In the curve shown in FIG. 1, there is a viscosity threshold temperature $T_0$, which is defined as the temperature at which the viscosity of the ink is midway between its minimum and maximum values. At $T_0$, the viscosity of the ink is sufficiently low such that it can flow easily. $T_0$ can typically range from about 55° C. to about 65° C. for exemplary gel inks. In exemplary embodiments, the ink is heated to at least the viscosity threshold temperature to allow the ink to flow sufficiently under the influence of surface/interfacial tension and interfacial capillary forces on a surface of a substrate.

Embodiments of the methods and apparatuses can level images formed on substrates to mitigate micro-banding of the images without physical contact with the images during the leveling. Embodiments of the methods and apparatuses can level inks on porous substrates with minimal print-through of the inks. Such porous substrates have open porosity extending from a front surface, on which the inks are deposited, toward an opposite back surface, on which inks can also be deposited. The open porosity can extend partially or completely through the thickness dimension of the substrate defined by the front and back surfaces. The pores are permeable to the ink. Show-through (ST) is defined as the back surface optical density. If OD(CP) is defined as the optical density (OD) of the front surface of a substrate covered by a blank sheet of a paper substrate, then print-through (PT) is defined as: PT=ST−OD(CP). In embodiments, the PT value is less than about 0.04, such as less than about 0.035, less than about 0.03, or less than about 0.025.

The methods and apparatuses can also be used to level inks, such as gel inks, and the like, on substrates other than plain paper, such as coated paper, plastic and metal films and laminates. These substrates can include a surface on which inks are deposited that is non-permeable with respect to the ink. The substrates can be composed of heat-sensitive materials, such as heat-sensitive plastics. Embodiments of the apparatuses can be used in xerography, lithography and flexography.

Embodiments of the apparatuses include at least one radiant energy source that emits radiation to heat inks on substrates. The emitted radiation produces a short-duration exposure over a small distance of the substrate. The radiation exposure supplies sufficient thermal energy to the inks to heat them to a point to reduce their viscosity to enable the inks to level by surface-tension driven lateral reflow on substrate surfaces. This lateral reflow mitigates micro-banding of images formed by the inks.

In embodiments, the radiation exposure desirably is sufficiently high and sufficiently brief to produce only minimal heat transfer from the ink to the substrate. This heat transfer desirably is insufficient to heat the substrate in contact with the ink to a temperature above the ink melting point. The radiation exposure can be effective to minimize print-through of gel inks, and the like, on porous substrates, such as plain paper.

Regarding the heating time of the inks on substrates, when the radiant energy source emits radiation at a fixed power level, a shorter pulse deposits less energy and heats inks less. The amount of radiant energy deposited can also be kept constant by raising the power level. In such embodiments, a shorter pulse at the higher power level results in a higher rate of temperature rise of inks. By optimizing the absorption of the radiant energy in the inks and using a desirably strong radiant energy source, the inks can be heated in a desirably short time, $t_{RAD}$.

When an ink on a surface of a porous substrate is at a particular temperature, the ink viscosity and surface tensions allow lateral reflow on the surface to reduce the surface area of the ink. The amount of time to achieve this lateral reflow of the ink is $t_{L-R}$. Similarly, capillary forces within the pores of the substrate lead to permeation into the substrate. The amount of time for the ink to permeate a given distance in such pores is $t_{PERM}$. Also, heat absorbed in the ink transfers by thermal conduction into the cooler substrate, heating the near-surface region of the substrate most and being conducted eventually to the opposite face of the substrate. There is a characteristic time, $t_{DIFF}$, for such thermal diffusion to occur in substrates. The value of $t_{DIFF}$ depends on factors including the heat capacity and thermal diffusivity of the substrate, as well as temperature gradients.

In embodiments of the leveling process, the following relationships between these time values are desirable: $t_{RAD}$ is comparable with, and shorter than $t_{L-R}$ and $t_{PERM}$; $t_{PERM}$ is longer than $t_{L-R}$; and $t_{L-R}$ is much shorter than $t_{DIFF}$. These relationships can be written as follows: $t_{RAD} \leq t_{L-R} < t_{PERM} << t_{DIFF}$. When $t_{DIFF}$ is sufficiently long, even if $t_{PERM}$ is short, the thermal gradient in the substrate will be sufficiently high and the ink will be quenched near the top surface of the substrate and mainly reflow laterally along that surface.

Figure 2:
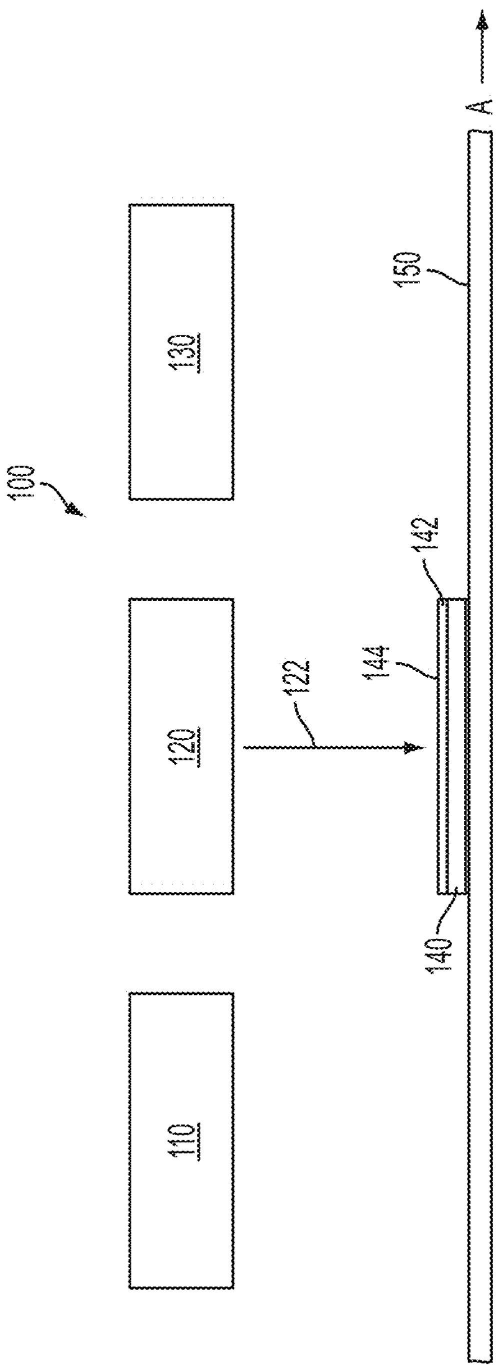
FIG. 2 depicts an exemplary embodiment of an apparatus useful for printing including a marking device, leveling device and optional curing device.

FIG. 2 depicts an exemplary embodiment of an apparatus 100 useful in printing. The apparatus 100 includes a marking device 110 for depositing ink onto substrates, and a leveling device 120 for irradiating the as-deposited ink with radiation of a selected spectrum to level the ink. The illustrated apparatus 100 also includes an optional UV curing device 130 for radiating as-leveled, UV-curable inks with UV radiation to cross-link the inks and provide robustness, when such inks are optionally used to form images on substrates.

FIG. 2 shows a substrate 140 supported on a transport device 150. The transport device 150 can be a belt, or the like. Other types of devices, such as rollers, can also be used to transport the substrate 140. An as-applied layer of ink 144 is shown on the top surface 142 of the substrate 140. The transport device 150 transports the substrate 140 in the process direction, A, past the marking device 110, leveling device 120 and the optional curing device 130 to produce images on the substrate 140. The leveling device 120 can typically be spaced from the marking device 110 by a distance of about 10 cm to about 50 cm along the process direction A. For a substrate 140 in the form of a continuous web, a stationary support device can be used in place of the transport device 150 and the web may be pulled over the support device configured to hold the web at a fixed distance from the marking device 110, leveling device 120 and optional curing device 130.

The marking device 110 can include one or more print heads (not shown). For example, the print heads can be heated piezo print heads. Typically, the marking device 110 includes a series of print heads. The print heads can typically be arranged in multiple, staggered rows in the marking device 110. The print heads can be constructed of stainless steel, or the like. The print heads can provide a modular, scalable array for making prints using different sizes of substrates. The print heads can use cyan, magenta, yellow and black inks, to allow inks of different colors to be printed atop each other.

The print heads can heat the ink to a sufficiently-high temperature to reduce the ink viscosity to the desired viscosity for jetting from the nozzles. For example, gel inks can be heated to a temperature above the viscosity threshold temperature. The hot ink is jetted as droplets from the nozzles of the print heads onto substrates being transported past the marking device 110. The print heads can produce the desired drop size and enable high-speed production.

Gel inks, such as UV gel inks, can be used in the print heads of the marking device 110. In other embodiments, other types of inks having suitable properties, such as wax inks, and the like, can be used in the marking device 110 to form images. Such inks can exhibit a large change in viscosity over a small change in temperature during cooling or heating. UV gel inks can typically be heated to a temperature of at least about 80° C. in the print heads to develop the desired viscosity for jetting. UV gel inks can typically exhibit a large increase in viscosity when they are cooled from the jetting temperature by about 10° C., e.g., from about 80° C. to about 70° C. When the ink impinges on a substrate, such as plain paper, heat is transferred from the ink to the cooler substrate. The as-deposited ink rapidly cools and develops a gel consistency on the substrate. Due to the rapid cooling, the ink does not have sufficient time to reflow laterally, or level, on the substrate. Consequently, images formed on the substrates with the inks can display microbanding.

Positive pressure pumps with computer controlled needle valves, such as a Smart Pump™ 20, available from nScrypt, Inc. of Orlando, Fla., can be used to eject inks. These pumps can eject very small volumes down to picoliters, at very high viscosities, such as viscosities above $10^6$ cP. Such pumps can be used to deposit gel inks at room temperature onto substrates. The deposited gel inks can then be leveled by embodiments of the apparatuses and methods described herein.

The leveling device 120 includes at least one radiant energy source that emits radiant energy onto the ink 144. The radiant energy can have an emission spectrum falling within the visible-infrared portion of the electromagnetic spectrum. In embodiments, the radiant energy source can be, e.g., a broadband, IR-VIS (infrared-visible radiation) radiant energy source with an emission spectrum that covers the visible range (~400 nm to 700 nm) and extends into the infrared range (>700 nm).

Figure 3:
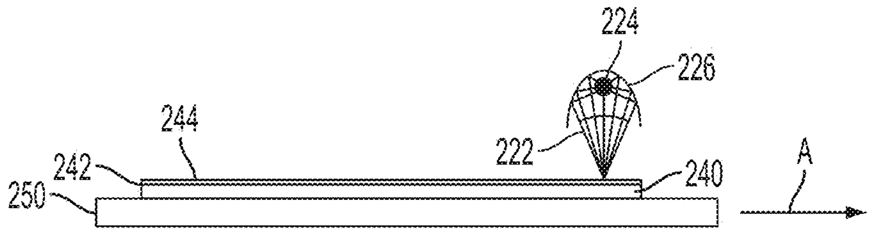
FIG. 3 depicts an exemplary embodiment of a radiant energy source of the leveling device.

FIG. 3 shows a substrate 240 positioned under an exemplary radiant energy source 224 of a leveling device. The substrate 240 is moved relative to the radiant energy source 224 on a transport device 250. The transport device 250 is movable in the process direction A to transport the substrate 240 past the marking device (not shown) and leveling device. An optional curing device (not shown) can also be used in some embodiments. The substrate 240 is typically oriented relative to the leveling device with the length dimension of the substrate extending along the process direction A. The radiant energy source 224 can typically be spaced from about 2 cm to about 5 cm from the surface of the substrate and from about 10 cm to about 50 cm downstream from the print heads along the process direction A. In embodiments, the substrate 240 can be a continuous web. For a continuous web, a stationary support device can be used in place of the transport device 250 and the web may be pulled over the support device to hold the web at a fixed distance from the marking device.

The substrate 240 includes a top surface 242. A layer of ink 244 is shown on the top surface 242. In the illustrated embodiment, the radiant energy source 224 is a lamp. A curved reflector 226 is configured to focus radiant energy emitted by the lamp onto the ink 244, to produce an exposure zone with a small focal width, along the length dimension of the substrate 240. The lamp produces an emission spectrum suitable for irradiating selected ink compositions. For example, the lamp can be a tungsten halogen lamp, or the like. In such lamps, the color temperature (i.e., the wavelength of the emission spectrum peak) can be adjusted to increase the amount of overlap between the lamp emission spectrum and the absorption spectrum of the ink. The leveling device can include a filter to transmit only a selected portion of the IR-VIS spectrum emitted by the radiant energy source.

In other embodiments, the leveling device can include at least one radiant energy source that emits radiation with emission peaks at several different wavelengths, such as a mercury discharge lamp, or the like.

In other embodiments, the leveling device can include at least one monochromatic radiant energy source that emits radiant energy at a single wavelength. For example, the radiant energy source can be a laser, such as a semiconductor diode laser or a laser array. A light-emitting diode array, or the like, can also be used.

The different radiant energy sources that can be used in the leveling device can achieve an exposure zone focal width ranging from about 0.5 mm to about 10 mm, for example. The leveling device can include a radiant energy guide, or the like, to direct radiant energy emitted by the radiant energy source over a small region of the substrate to reduce the ink surface that is irradiated.

In embodiments, the radiant energy source is stationary and the substrate is moved past the radiant energy source to radiate the substrate. At a given transport speed of the substrate relative to the leveling device, reducing the focal width of the radiant energy source reduces the exposure time of ink on the substrate. For single radiant energy sources, such as a tungsten filament extended across the width dimension of the substrate perpendicular to the process direction, the radiant energy source can be turned ON throughout the leveling process to allow the entire substrate surface to be irradiated as the substrate is moved past the radiant energy source.

In other embodiments, the radiant energy source can be movable to allow radiation to be scanned over the substrate. For example, the radiant energy source can be a laser extending continuously across the width of the substrate, or a laser including laser bars arrayed in segments along the width dimension of the substrate. Lasers can be focused to scan a narrow line having a focal width of, e.g., less than about 1 mm in the process direction on the substrate. For such radiant energy sources, the radiation can be emitted only to irradiate regions of the substrate surface where ink is present to limit heating of the substrate and to limit unnecessary power consumption.

The base supporting the substrate can be a cooled heat sink to transfer heat away from the substrate during irradiation of the ink at the leveling device to control the ink and substrate temperatures during the leveling process, to minimize print-through.

In other embodiments, the substrate may not be supported on a heat sink when sufficient lateral reflow of ink on the substrate can be achieved without concern that the substrate may reach a sufficiently-high temperature during radiation of the ink to result in more than a minimal amount of vertical transport of the ink in porous substrates. In embodiments, some amount of vertical transport of the ink is desired to provide sufficient fixing of ink to porous substrates. In non-porous substrates, such as non-porous plastics and metals, chemical bonding of the ink to the substrate surface, and micro-porosity at the substrate surface, can provide sufficient fixing of the ink to the surface.

In the apparatus 100 shown in FIG. 2, the substrate 140 moves in the process direction A at a selected speed relative to the stationary leveling device 120. The radiant energy source of the leveling device 120 irradiates the ink 144 as the substrate 140 is moved relative to the radiant energy source. The radiant energy source can emit radiation over a distance in the process direction A of only about 0.5 to about 10 mm, depending on the particular source used. The substrate 140 can typically be moved at a speed up to about 1 m/s relative to the radiant energy source. The ink 144 on the substrate 140 is irradiated for only a short amount of time as the substrate 140 is moved relative to the radiant energy source. For example, a radiant energy source that emits focused radiation over a distance of about 10 mm can provide an exposure time of the ink of about 10 ms for a substrate speed of about 1 m/s. More-tightly-focused sources can be used to enable shorter exposure times and thermal transfer times of inks. Increasing the transport speed of the substrate can be used to reduce the exposure time of the ink 144 on the substrate 140.

In the apparatus 100, the radiation emitted by the radiant energy source onto the ink 144 is effective to heat the ink and lower the ink viscosity sufficiently to allow lateral reflow, or thermal reflow leveling, of the ink on the top surface 142 of the substrate 140. The ink can be partially melted or fully melted by the radiant energy, with full melting producing greater reflow coverage and more desirable leveling. The ink can be heated sufficiently rapidly by the radiant energy source that heat transfer from the ink to the substrate 140 is sufficiently small during the leveling that ink at the substrate interface is cooled to a temperature below the viscosity threshold temperature thereby preventing any significant ink permeation into the substrate 140. The "substrate interface" is defined as where the ink contacts the substrate, which may be at the top surface 142, or below the top surface 142. Penetration of the ink 144 into the substrate 140 resulting from heating can be limited to a maximum depth of, e.g., less than about 20 μm, less than about 10 μm, less than about 5 μm, less than about 4 μm, less than about 3 μm, or less than about 2 μm. Consequently, print-through of porous substrates, such as plain paper, by vertical ink flow can be substantially eliminated. The lateral reflow of the ink 144 improves optical density by mitigating micro-banding of the ink 144 on the substrate 140.

Different inks that can be used in embodiments of the methods and apparatuses can have different viscosities and surface tensions at the leveling target temperature. Leveling process parameters including dwell time and the irradiation power and emission spectrum of the radiant energy source can be selected to be compatible with the properties of the inks used in the methods and apparatuses, to produce desirable reflow and leveling of the inks driven by surface tension and capillary forces.

Figure 4:
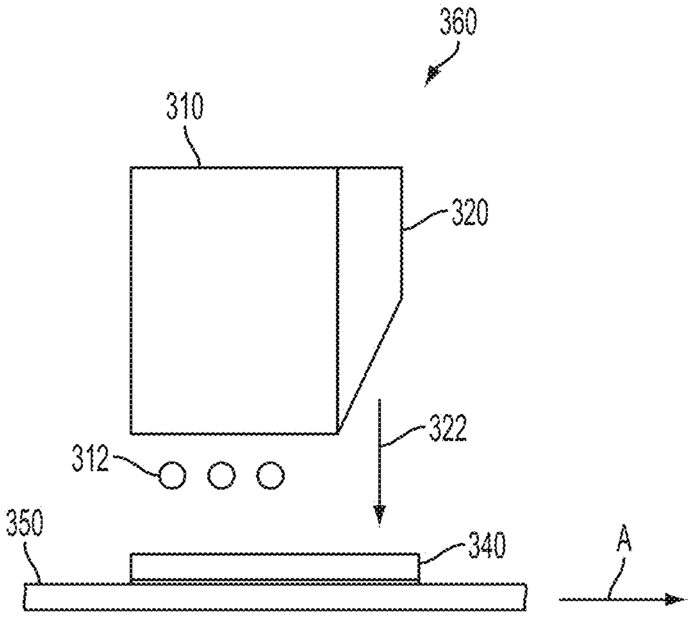
FIG. 4 depicts an exemplary embodiment of a combined marking/leveling device.

FIG. 4 depicts an exemplary embodiment of a device 360 that provides both marking and leveling functions. As shown, the device 360 includes a marking section 310 and a leveling section 320 positioned downstream about 0.5 cm to about 5 cm from the marking section 310 along the process direction A. A substrate 340 is shown supported on a transport device 350 to move the substrate 340 along the process direction A. The marking section 310 can include a single print head (not shown), for example. The leveling device 320 includes at least one radiant energy source (not shown). The radiant energy source can be a broad band IR-VIS radiant energy source, such as a tungsten lamp, or the like; a radiant energy source that can emit at more than one wavelength; or a monochromatic radiant energy source. During operation, hot ink drops 312 are jetted from the print head, or ambient-temperature ink drops are ejected from a positive pressure pump, onto the substrate 340, and then immediately irradiated with radiation 322 from the radiant energy source to maintain/bring the hot jetted ink at/to leveling temperature for a sufficient amount of time to achieve the desired reflow. In embodiments, the substrate 340 can be a continuous web. For a continuous web, a stationary support device can be used in place of the transport device 350 and the web may be pulled over the support device constructed to hold the web at a fixed distance from the marking device 310, leveling device 320 and the optional curing device.

The immediate irradiation of as-deposited ink on the substrate 340 can at least substantially eliminate the need to melt solidified ink (using an additional amount of thermal energy) on the substrate 340 in order to have thermal reflow leveling of completely-liquid ink. Irradiating the ink immediately after deposition with the marking/leveling device 360 can increase the total amount of time that the ink remains at temperatures above the low-viscosity transition due to the as-deposited ink either having a smaller temperature drop before being reheated to the leveling temperature, or being maintained at a substantially-constant temperature that is sufficient for leveling. The combined marking/leveling device 360 can reduce the total amount of energy that is sufficient to achieve the desired leveling, the total time, and the total process waterfront needed for marking and leveling.

In cases where the heating power of the radiant energy source may be limited, the combined marking/leveling device can enable a higher process speed to be used because a smaller amount of thermal energy from the radiant energy source can be sufficient to achieve the desired leveling, as thermal energy in the as-applied ink is used for the leveling. The same amount of power emitted by the radiant energy source can heat the ink to a higher temperature at a fixed process speed. A higher process speed can be used with the ink maintained at the desired leveling temperature.

Embodiments of the apparatuses including a combined marking/leveling device can use a radiant energy source for each print head and each stage of marking, in contrast to performing leveling after ink has been deposited on substrates from all print heads of marking devices including multiple print heads. In apparatuses including a combined marking/leveling device, the amount of radiation emitted from each radiant energy source can be set based on the amount of ink deposited at each associated print head, which allows close control of the amount and duration of each exposure.

Black inks have a broad absorption band that extends across a substantial portion of the emission spectrum of IR-VIS lamps. For other ink colors, such as cyan, which have a narrower absorption band than black inks, to provide a significant effect with respect to preventing print-through on porous substrates, the color temperature of the IR-VIS lamp can be raised relative to the temperature used for leveling black inks, and the ink formulations can be changed to contain a higher gel and wax content.

Gel ink formulations can be tuned by adding one or more IR absorbers, to increase the amount of overlap between the lamp emission spectrum and the absorption spectrum of the ink.

Figure 5:
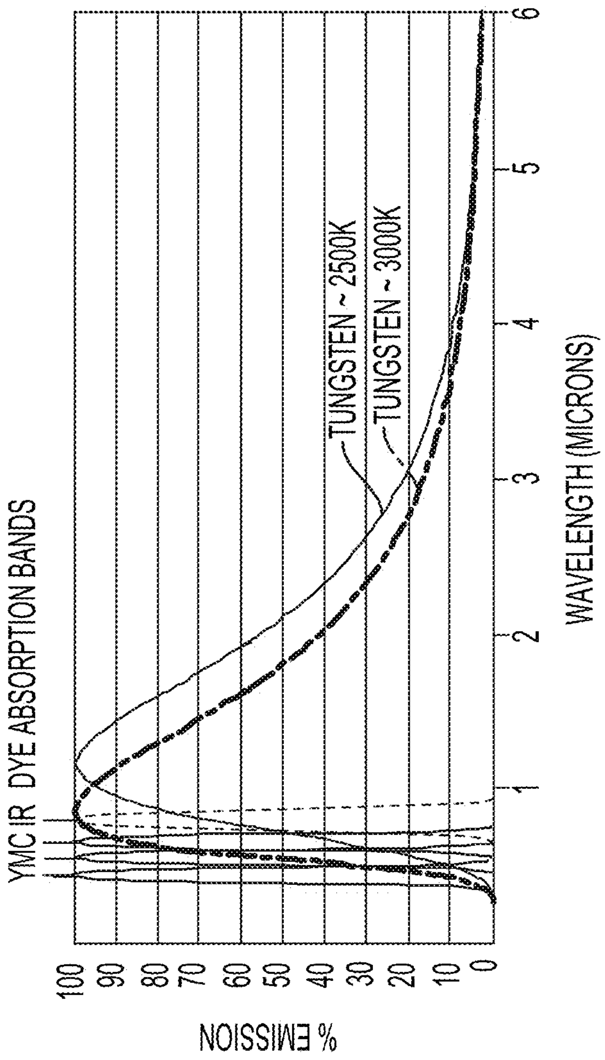
FIG. 5 illustrates curves depicting % emission versus emission wavelength showing the overlap of the emission spectrum of tungsten lamps at color temperatures of about 2500K and 3000K with generalized absorbance spectra of yellow (Y), magenta (M), cyan (C) and infrared (IR) absorbing dyes.

FIG. 5 illustrates curves depicting % emission versus emission wavelength showing the overlap of the emission spectrum of tungsten lamps at color temperatures of about 2500K and 3000K with generalized absorbance spectra of yellow (Y), magenta (M), cyan (C) and infrared (IR) absorbing pigments or dyes.

Carbon black ink has a high absorbance over the entire visible and near IR region. As shown in FIG. 5, in general the absorbance of cyan ink is predominantly in the red region of the visible spectrum. To achieve higher absorbance of such cyan inks, the color temperature of the radiant energy source (e.g., tungsten halogen lamp) can be increased and/or an IR absorber can be added to the cyan ink. FIG. 5 shows poor overlap of the emission spectrum of a tungsten lamp operated at a temperature of 2500K with a cyan pigment, or with an IR absorbing dye. The overlap is considerably better when the tungsten lamp is operated at a higher temperature of 3000K.

In other embodiments, the radiant energy source(s) of the leveling device can be a monochromatic source, such as a scanning laser focused to scan a narrow line across substrates in the cross-process direction. To level cyan, magenta or yellow inks containing an IR absorbing pigment or dye, the laser can be selected to emit radiation at a wavelength of, e.g., 1.06 μm or 0.9 μm (GaAs) depending on the absorption spectrum of the IR pigment or dye. The radiant energy source can also be an arc lamp, such as a deuterium lamp, which in addition to an output of leveling radiation in the visible region of the spectrum (400-700 nm), also has significant output of curing radiation in the UV region of the spectrum (200-400 nm).

EXAMPLES

Example 1

Black ink was deposited on plain paper and then irradiated to level the ink. In Example 1, a tungsten halogen lamp with an elliptical reflector (FIG. 3) was used to produce an approximately 10 mm focal width exposure zone and to irradiate the ink deposited on the paper. The tungsten halogen lamp was a Model No. GE QH 1200 W HT 144V from General Electric Co. The lamp had a rated power of 1200 W with a color temperature of 2450K when driven at the rated lamp voltage of 144 V. The lamp was operated at an actual lamp voltage of 208 V and actual power of 2114 W (423 W/in) with a color temperature of about 2812K.

The lamp generally irradiated beyond the edges of the paper. The paper substrates were supported on a water-cooled cold shoe maintained at a temperature of about 10° C. The cold shoe dissipated heat transferred to the substrate during the irradiation to cool the substrate and hinder ink penetration through the paper. To provide effective thermal transfer to the cold shoe, the paper was held in contact with the top surface of the cold shoe using 3M™ Spray Mount™ Artist's Adhesive, available from 3M of Saint Paul, Minn. This thermal contact was maintained during the entire process of depositing ink on the paper, off-line leveling and off-line UV curing.

A series of images was printed onto Xerox 4200 paper using a standard black ink formulation (BK30557-31) containing 7.5 wt % gel and 5 wt % wax with a modified 600×600 dpi patch (every seventh line blank) beside a 600×300 dpi patch. To investigate the ability of the focused IR lamp to produce desirable lateral leveling without significant paper heating and associated vertical ink penetration and print through, the printed patches were passed under the lamp at a series of decreasing transport speeds, ranging from 1 m/s down to 125 mm/s. The top (front) surface optical density (OD) of the 600×600 dpi patches was used as a quantitative measure of the lateral ink spreading. Print-through was used as a quantitative measure of vertical ink penetration from the top surface through the paper. Show-through (ST) was defined as the optical density of the back surface of the paper. Defining OD(CP) as the optical density of the top surface of the paper covered with a blank sheet of the paper substrate, print-through (PT) was defined as: PT=ST−OD(CP). OD, OD(CP) and ST were measured with a Gretag Macbeth model RD-918 densitometer. A print-through value of less than 0.025 was not visually objectionable and was considered to be acceptable. A print-through value of 0.025 was visually objectionable and considered to be unacceptable.

Pictures of the printed patches taken from the top and the bottom sides of the paper substrates are shown in FIGS. 6A to 6F. FIG. 6A shows as-printed patches and FIGS. 6B to 6F show patches following leveling for paper transport speeds of 1000 mm/s, 750 mm/s, 500 mm/s, 250 m/s and 125 mm/s, respectively.

FIG. 7 illustrates curves showing the optical density and the corresponding print-through for the as-leveled 600×600 dpi patches depicted in FIGS. 6B to 6F. The as-printed optical density and print-through for the patches depicted in FIG. 6A are also shown for comparison.

As shown, the optical density of the 600×600 dpi patch leveled at a transport speed (process speed) of 1 m/s increases over that of the as-printed substrate due to lateral ink spreading. The desired leveling is achieved. The optical density of the substrate leveled at a transport speed of 750 mm/s also increases slightly with respect to the substrate leveled at 1 m/s. The desired leveling is achieved. The optical density of the substrate leveled at a transport speed of 500 mm/s decreases to the optical density of the as-printed substrate due to print-through starting to occur. Further reduction in the transport speed/increase in exposure, at speeds of 250 mm/s and 125 mm/s, results in higher print-through and the optical density decreasing to below that of the as-printed substrate.

The test results as plotted in FIG. 7 and as viewed in FIGS. 6A to 6F show that the focused IR-VIS lamp at a color temperature of about 2800K achieves good leveling of black ink without unacceptable print-through, PT 0.025, over a process window in the region of at least about 750 mm/s to 1000 mm/s. This is consistent with the visual appearance of the back sides of the stress case 600×600 dpi images in FIGS. 6B and 6C, which are not judged to be objectionable, and are acceptable. For throughput speeds of 500 mm/s or slower, as seen in FIGS. 6D to 6F, the print-through is unacceptable, PT 0.025, and it increases with reducing speed or increasing dwell time in the lamp exposure zone.

Example 2

A standard cyan ink formulation (BK30461-68A) containing 7.5 wt % gel and 5 wt % wax was used. To increase the overlap of the emission spectrum of the radiant energy source with respect to the absorbance spectrum of the cyan ink, a different lamp was used to increase the color temperature achievable with a voltage of 208V. The lamp was a model 500T3/CL available from Research Inc., of Eden Prairie, Minn. The lamp has a rated power of 500 W with a color temperature of 2500K when driven with a rated voltage of 120V. The lamp was driven at an actual voltage of 208V with an actual power of 1166 W and an actual color temperature of 3073K.

A series of images was printed onto Xerox 4200 paper using the standard cyan UV gel ink formulation. FIGS. 8A to 8F show pictures, top side right to left (left half of FIGS. 8A to 8F), and bottom side left to right (right half of FIGS. 8A to 8F) of 600×600 dpi patches, 600×600 dpi patches modified with every seventh line blank, 600×150 dpi patches, and 150×150 dpi patches. The printed cyan patches were transported under the lamp operating at the color temperature of 3073K at speeds of 1000 mm/s, 750 mm/s, 500 mm/s, 250 mm/s and 125 mm/s. The optical density of the unmodified 600×600 dpi patches was used as a measure of the lateral ink spreading, and print-through was used as a measure of ink penetration through the paper.

Pictures of the printed patches from the top and bottom sides are shown in FIGS. 8A to 8E. FIG. 8A shows as-printed patches. FIGS. 8B to 8F show patches following leveling for paper transport speeds of 1000 mm/s, 750 mm/s, 500 mm/s, 250 mm/s and 125 mm/s, respectively.

FIG. 9 illustrates curves showing the optical density and the corresponding print-through for the as-leveled 600×600 dpi patches depicted in FIGS. 8B to 8F. The as-printed optical density and print-through for the patches depicted in FIG. 8A are also shown for comparison.

In general, all samples exhibit undesirably-high print-through as judged by the visual appearance of the back side images in FIG. 8. For all process conditions, the appearance of the back side of the 600×600 dpi areas is visually objectionable and unacceptable. This is consistent with the measured print-through in FIG. 9, where PT 0.025 for all images. Print-through also increases as throughput speed decreases and dwell time increases. Although the standard cyan ink absorbs more energy at the higher color temperature exposure, there is no window of operation at the substrate transport speeds used where the cyan ink is leveled with acceptable print-through.

Example 3

Example 2 was repeated using the same lamp illumination conditions, but with a high-gel (10 wt %) and high-wax (10 wt %) cyan ink formulation (JBJF30554-15) to provide more process latitude for leveling ink and acceptable print-through.

A series of images were printed onto 4200 paper using the high-gel and high-wax cyan ink. FIGS. 10A to 10F show pictures, top side right to left and bottom side also right to left, of 600×600 dpi patches, 600×600 dpi patches modified with every seventh line blank, 600×150 dpi patches, and 150×150 dpi patches. The printed cyan patches were transported under the lamp operating at the color temperature of 3073K at speeds of 1000 mm/s, 750 mm/s, 500 mm/s, 250 mm/s and 125 mm/s. The optical density of the unmodified 600×600 dpi patches was used as a measure of the lateral ink spreading, and print-through was used as a measure of ink penetration through the paper.

FIG. 11 illustrates curves showing the optical density and the corresponding print-through for the as-leveled 600×600 dpi patches depicted in FIGS. 10B to 10F. The as-printed optical density and print-through for the patches depicted in FIG. 10A are also shown for comparison. The test results show that using a high-gel, high-wax cyan ink formulation, has the effect of preventing ink penetration into the paper while still enabling some degree of leveling to occur. Some degree of leveling occurs as judged by the increase in optical density over the as-printed sample for the irradiated samples with throughput speeds in the process window of about 500 mm/s to 1000 mm/s. All samples exhibit acceptable print-through as judged by visual appearance of the back side images of the 600×600 dpi areas except for FIG. 10F. This is consistent with the plot in FIG. 11, where the print-through rises above the acceptable level, PT 0.025, for the slowest throughput speed of 125 mm/s.

In embodiments of the methods of leveling ink on substrates, it is desirable to produce leveling of the ink on a substrate surface substantially without any simultaneous curing of the ink. Curing will impede leveling of the corrugated structure formed by ink droplet freezing on substrate impingement. If leveling is impeded, then micro-banding will not be effectively mitigated and completely missing lines will not be effectively covered. Curing of the ink results when cross-linking or polymerization reactions occur in the ink. In embodiments, the radiation source used for leveling the ink is selected to emit radiant energy onto the ink that produces substantially no curing during leveling.

In other embodiments of the methods of leveling ink on substrates, a small amount of curing may also occur during the leveling of the ink, in cases where a portion of the emission spectrum of the radiation source may be capable of causing curing in the ink composition being leveled, and this portion is not removed, such as by filtering. For example, this can occur if the leveling lamp is a deuterium arc lamp with a quartz bulb (which will pass all UV output), or a cerium doped glass bulb which will filter UVC (200-290 nm) and UVB (290-320 nm), but will pass UVA (320-400 nm). However, in those embodiments, the radiation source can emit radiant energy effective to heat the ink to a sufficient temperature to produce leveling while reducing the ink viscosity at a faster rate and/or by a larger magnitude, than any cross-linking or polymerization of the ink can increase the ink viscosity. As a consequence of the ink viscosity being reduced in this manner by a temperature change, any curing that may occur in the ink during leveling substantially does not impede leveling and the desired results of the leveling on the ink can still be achieved.

In embodiments in which curing of the ink is desired to achieve robustness of images on substrates, the ink can be exposed to radiant energy effective to produce the desired curing of the ink composition subsequent to leveling of the ink.

It will be appreciated that various ones of the above-disclosed, as well as other features and functions, or alternatives thereof, may be desirably combined into many other different systems or applications. Also, various presently unforeseen or unanticipated alternatives, modifications, variations or improvements therein may be subsequently made by those skilled in the art, which are also intended to be encompassed by the following claims.

What is claimed is:

1. A method of leveling ink on a substrate, the method comprising irradiating ink disposed on a first surface of a porous substrate with first radiation emitted by at least one first radiant energy source, the first radiation heating the ink to at least a viscosity threshold temperature of the ink to allow the ink to flow laterally on the first surface to produce leveling of the ink, the ink being heated sufficiently rapidly that heat transfer from the ink to the substrate is sufficiently small during the leveling that ink at the substrate interface is cooled to a temperature below the viscosity threshold temperature thereby preventing any significant ink permeation into the substrate.

2. The method of claim 1, wherein the ink has a viscosity range of about $10^1$ to about $10^6$ cP over a temperature range.

3. The method of claim 2, wherein the temperature range is less than about 40 Celsius degrees.

4. The method of claim 1, wherein the ink is a gel ink.

5. The method of claim 1, wherein substantially no curing of the ink is produced by irradiating the ink with the first radiation emitted by the at least one first radiant energy source.

6. The method of claim 1, wherein the ink is an ultraviolet light (UV) curable ink.

7. The method of claim 6, further comprising irradiating ink on the first surface of the substrate with UV radiation emitted by a second radiant energy source to cross-link the ink subsequent to leveling of the ink.

8. The method of claim 1, wherein the first radiation has an emission spectrum falling within the visible-infrared portion of the electromagnetic spectrum.

9. The method of claim 1, wherein the first radiation has an emission spectrum with emission peaks at more than one wavelength.

10. The method of claim 1, wherein the first radiation is monochromatic light.

11. The method of claim 1, wherein the at least one first radiant energy source comprises at least one lamp and a reflector positioned relative to each lamp to reflect the first radiation onto the ink on the first surface of the substrate.

12. The method of claim 1, further comprising:

heating the ink to a temperature greater than the viscosity threshold temperature; and applying the heated ink to the first surface of the substrate with at least one print head.

13. The method of claim 12, wherein the ink on the first surface of the substrate is irradiated with the first radiation to level the ink immediately after applying the ink to the first surface.

14. The method of claim 1, wherein the substrate is moved relative to the at least one first radiant energy source while irradiating the ink with the first radiation.

15. The method of claim 1, further comprising cooling the second surface of the substrate while irradiating the ink with the first radiation.

16. The method of claim 1, wherein print-through (PT) of the ink in the substrate has a value of less than about 0.04 as determined by the equation: PT=show-through (ST)−OD (CP), in which ST is the optical density of the second surface of the substrate, OD(CP) is the optical density of the first surface of the substrate covered by a blank substrate of the same material as the first substrate, and ST and OD(CP) are measured by a densitometer.

17. A method of leveling ink on a substrate, the method comprising irradiating a gel ink disposed on a surface of a substrate with first radiation emitted by at least one first radiant energy source, the surface being non-permeable with respect to the gel ink, the first radiation rapidly heating the gel ink to at least a viscosity threshold temperature of the gel ink to allow the gel ink to flow laterally on the surface to produce leveling of the gel ink.

18. The method of claim 17, wherein substantially no curing of the gel ink is produced by irradiating the gel ink with the first radiation emitted by the at least one first radiant energy source.

19. The method of claim 17, further comprising irradiating the gel ink on the surface of the substrate with UV radiation emitted by a second radiant energy source to cross-link the gel ink subsequent to leveling of the gel ink.

* * * * *